(12) United States Patent
Wang

(10) Patent No.: US 10,659,049 B2
(45) Date of Patent: May 19, 2020

(54) LEVEL SHIFTING CIRCUIT

(71) Applicant: BOE TECHNOLOGY GROUP CO., LTD., Beijing (CN)

(72) Inventor: Tangxiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/338,349

(22) PCT Filed: May 22, 2018

(86) PCT No.: PCT/CN2018/087831
§ 371 (c)(1),
(2) Date: Mar. 29, 2019

(87) PCT Pub. No.: WO2018/219177
PCT Pub. Date: Dec. 6, 2018

(65) Prior Publication Data
US 2019/0229733 A1 Jul. 25, 2019

(30) Foreign Application Priority Data

Jun. 2, 2017 (CN) .......................... 2017 1 0409736

(51) Int. Cl.
 *H03K 19/0185* (2006.01)
 *H03K 19/003* (2006.01)
(52) U.S. Cl.
 CPC ........... *H03K 19/018507* (2013.01); *H03K 19/00361* (2013.01); *H03K 19/018521* (2013.01)

(58) Field of Classification Search
 CPC ..... H03K 19/018507; H03K 19/00361; H03K 19/018514; H03K 19/018521; H03K 19/018528
 See application file for complete search history.

(56) References Cited

U.S. PATENT DOCUMENTS 6,774,695 B2 * 8/2004 Hayashi ........... H03K 19/00323
326/63

\* cited by examiner

*Primary Examiner* — Jung Kim
(74) *Attorney, Agent, or Firm* — Nath, Goldberg & Meyer; Joshua B. Goldberg

(57) ABSTRACT

The present disclosure provides a level shifting circuit which includes a boost subcircuit and a first phase-inverting subcircuit. The boost subcircuit has a first terminal being coupled to an input terminal of the level shifting circuit, a second terminal being coupled to a first high level signal terminal, a third terminal being coupled to a low level signal terminal, a fourth terminal being coupled to a first terminal of the first phase-inverting subcircuit; the first phase-inverting subcircuit has a second terminal being coupled to the first high level signal terminal, a third terminal being coupled to the low level signal terminal, a fourth terminal being coupled to a first output terminal of the level shifting circuit, the first phase-inverting subcircuit is configured to cause the third terminal to be electrically coupled to the fourth terminal when the first terminal thereof receives a high level signal.

19 Claims, 4 Drawing Sheets

US 10,659,049 B2

LEVEL SHIFTING CIRCUIT

This is a National Phase Application filed under 35 U.S.C. 371 as a national stage of PCT/CN2018/087831, filed May 22, 2018, an application claiming the benefit of Chinese Application No. 201710409736.8, filed Jun. 2, 2017, the content of each of which is hereby incorporated by reference in its entirety.

TECHNICAL FIELD

The present disclosure relates to the field of semiconductor integrated circuit, and in particular to a level shifting circuit.

BACKGROUND

A level shifting circuit, which converts a low voltage control signal into a high voltage control signal so that a high voltage power output stage can be controlled by a low voltage logic, is widely applied in organic electroluminescence, FLASH storage and the like. As a crucial circuit connecting the control circuit and the output driver stage, the level shifting circuit is required to have a high driving capability to meet the driving requirements of the output stage; and on the other hand, it is also required to have a relatively low quiescent current to reduce power consumption.

SUMMARY

The present disclosure provides a level shifting circuit including a boost subcircuit and a first phase-inverting subcircuit, the boost subcircuit has a first terminal being coupled to an input terminal of the level shifting circuit, a second terminal being coupled to a first high level signal terminal, a third terminal being coupled to a low level signal terminal, a fourth terminal being coupled to a first terminal of the first phase-inverting subcircuit; the boost subcircuit is configured to electrically connect the second terminal and the fourth terminal of the boost subcircuit when the input terminal of the level shifting circuit receives one of a high level signal and a low level signal, and to electrically connect the third terminal and the fourth terminal of the boost subcircuit when the input terminal of the level shifting circuit receives the other of the high level signal and the low level signal; a voltage of the high level signal received by the input terminal of the level shifting circuit is smaller than a voltage of a signal at the first high level signal terminal;

the first phase-inverting subcircuit has a second terminal being coupled to the first high level signal terminal, a third terminal being coupled to the low level signal terminal, and a fourth terminal being coupled to a first output terminal of the level shifting circuit, the first phase-inverting subcircuit is configured to electrically connect the third terminal and the fourth terminal of the first phase-inverting subcircuit when the first terminal of the first phase-inverting subcircuit receives a high level signal; and to electrically connect the second terminal and the fourth terminal of the first phase-inverting subcircuit when the first terminal of the first phase-inverting subcircuit receives a low level signal;

a first current limiting subcircuit is provided between the second terminal and the fourth terminal of the first phase-inverting subcircuit, or between the third terminal and the fourth terminal of the first phase-inverting subcircuit, and the first current limiting subcircuit is configured to limit a current flowing therethrough such that a maximum value of the current does not exceed a first predetermined value.

Optionally, the first phase-inverting subcircuit includes:

a first P-type transistor having a gate electrode being coupled to the first terminal of the first phase-inverting subcircuit, a first electrode being coupled to the second terminal of the first phase-inverting subcircuit, and a second electrode being coupled to the fourth terminal of the first phase-inverting subcircuit; and a first N-type transistor having a gate electrode being coupled to the first terminal of the first phase-inverting subcircuit, a first electrode being coupled to the fourth terminal of the first phase-inverting subcircuit, and a second electrode being coupled to the third terminal of the first phase-inverting subcircuit.

Optionally, the boost subcircuit is configured to electrically connect the second terminal and the fourth terminal of the boost subcircuit when the first terminal thereof receives a high level signal;

the first current limiting subcircuit includes a second N-type transistor, the second N-type transistor has a gate electrode being coupled to a first current limiting control terminal, a first electrode being coupled to the fourth terminal of the first phase-inverting subcircuit, and a second electrode being coupled to the first electrode of the first N-type transistor; the first current limiting control terminal is configured to provide a low level signal to turn off the second N-type transistor when the input terminal of the level shifting circuit receives a low level signal, and to provide a high level signal enabling the second N-type transistor to be in a saturation region when the input terminal of the level shifting circuit receives a high level signal; and the first predetermined value is a magnitude of a driving current between the first electrode and the second electrode of the second N-type transistor when the second N-type transistor is in the saturation region.

Optionally, an aspect ratio of the second N-type transistor is smaller than an aspect ratio of the first N-type transistor and an aspect ratio of the first P-type transistor.

Optionally, the aspect ratio of the second N-type transistor is 0.2 to 0.4 times the aspect ratio of the first N-type transistor.

Optionally, the first current limiting control terminal is formed integrally with the input terminal of the level shifting circuit.

Optionally, the first current limiting subcircuit is provided between the second terminal and the fourth terminal of the first phase-inverting subcircuit, and includes a sixth P-type transistor, the sixth P-type transistor has a gate electrode being coupled to a first current limiting control terminal, a first electrode being coupled to the second terminal of the first phase-inverting subcircuit, and a second electrode being coupled to the first electrode of the first P-type transistor; the first current limiting control terminal is configured to provide a low level signal to cause the sixth P-type transistor to be in a saturation state when the input terminal of the level shifting circuit receives a low level signal, and to cause the sixth P-type transistor to be turned off when the input terminal of the level shifting circuit receives a high level signal; and the first predetermined value is a magnitude of a driving current between the first electrode and the second electrode of the sixth P-type transistor when the sixth P-type transistor is in the saturation state.

Optionally, the level shifting circuit further includes a second phase-inverting subcircuit, the second phase-inverting subcircuit has a first terminal being coupled to a fifth terminal of the boost subcircuit, a second terminal being coupled to the first high level signal terminal, a third terminal being coupled to the low level signal terminal, and a fourth terminal being coupled to a second output terminal of the level shifting circuit; the second phase-inverting subcircuit is configured to electrically connect the third terminal and the fourth terminal thereof when the first terminal thereof receives a high level signal, and to electrically connect the second terminal and the fourth terminal thereof when the first terminal thereof receives a low level signal;

the boost subcircuit is configured to electrically connect the second terminal and the fourth terminal of the boost subcircuit when the first terminal thereof receives a high level signal; and to electrically connect the third terminal and the fourth terminal of the boost subcircuit, to electrically connect the second terminal and the fifth terminal of the boost subcircuit, when the first terminal of the boost subcircuit receives a low level signal.

Optionally, the second phase-inverting subcircuit includes:

a second P-type transistor having a gate electrode being coupled to the first terminal of the second phase-inverting subcircuit, a first electrode being coupled to the second terminal of the second phase-inverting subcircuit, and a second electrode being coupled to the fourth terminal of the second phase-inverting subcircuit; and a third N-type transistor having a gate electrode being coupled to the first terminal of the second phase-inverting subcircuit, a first electrode being coupled to the fourth terminal of the second phase-inverting subcircuit, and a second electrode being coupled to the third terminal of the second phase-inverting subcircuit.

Optionally, a second current limiting subcircuit is provided between the second terminal and the fourth terminal of the second phase-inverting subcircuit, or between the third terminal and the fourth terminal of the second phase-inverting subcircuit, and the second current subcircuit is configured to limit a current flowing therethrough such that a maximum value of the current does not exceed a second predetermined value.

Optionally, the second current limiting subcircuit includes a fourth N-type transistor, the fourth N-type transistor has a gate electrode being coupled to a second current limiting control terminal, a first electrode being coupled to the fourth terminal of the second phase-inverting subcircuit, a second electrode being coupled to the first electrode of the third N-type transistor; the second current limiting control terminal is configured to provide a low level signal to turn off the fourth N-type transistor when the input terminal of the level shifting circuit receives a high level signal, and to provide a high level signal causing the fourth N-type transistor to be in a saturation region when the input terminal of the level shifting circuit receives a low level signal; and the second predetermined value is a magnitude of a driving current between the first electrode and the second electrode of the fourth N-type transistor when the fourth N-type transistor is in the saturation region.

Optionally, an aspect ratio of the fourth N-type transistor is smaller than an aspect ratio of the third N-type transistor and an aspect ratio of the second P-type transistor.

Optionally, the aspect ratio of the fourth N-type transistor is 0.2 to 0.4 times the aspect ratio of the third N-type transistor.

Optionally, the boost subcircuit includes a phase inverter, a fifth N-type transistor, a sixth N-type transistor, a third P-type transistor and a fourth P-type transistor;

the phase inverter has a first input terminal being coupled to the first terminal of the boost subcircuit, a second input terminal being coupled to a second high level signal terminal, a third input terminal being coupled to the low level signal terminal, and an output terminal being coupled to a gate electrode of the sixth N-type transistor; the phase inverter is configured to electrically connect the third input terminal and the output terminal of the phase inverter when the first input terminal of the phase inverter receives a high level signal, and to electrically connect the second input terminal and the output terminal of the phase inverter when the first input terminal of the phase inverter receives a low level signal; and a voltage of a signal at the second high level signal terminal is smaller than a voltage of a signal at the first high level signal terminal;

the fifth N-type transistor has a gate electrode being coupled to the first terminal of the boost subcircuit, a first electrode being coupled to the fifth terminal of the boost subcircuit, and a second electrode being coupled to the third terminal of the boost subcircuit;

the sixth N-type transistor has a first electrode being coupled to the fourth terminal of the boost subcircuit, and a second electrode being coupled to the third terminal of the boost subcircuit;

the third P-type transistor has a gate electrode being coupled to the fourth terminal of the boost subcircuit, a first electrode being coupled to the second terminal of the boost subcircuit, and a second electrode being coupled to the fifth terminal of the boost subcircuit; and the fourth P-type transistor has a gate electrode being coupled to the fifth terminal of the boost subcircuit, a first electrode being coupled to the second terminal of the boost subcircuit, and a second electrode being coupled to the fourth terminal of the boost subcircuit.

Optionally, the second current limiting control terminal is formed integrally with the output terminal of the phase inverter.

BRIEF DESCRIPTION OF THE FIGURES

The drawings, which constitute a part of the specification, are provided for purposes of further understanding the technical solutions of the present disclosure, and should not be considered as a limitation thereof. In the drawings.

REFERENCE SIGNS

10. Low voltage phase inverter; M1. First transistor; M2. Second transistor; M3. Third transistor; M4. Fourth transistor; M5. Fifth transistor; M6. Sixth transistor; IN. Input terminal of the level shifting circuit; OUT. Output terminal of the level shifting circuit; V1. First high level signal terminal; V2. Second high level signal terminal; VSS. Low level signal terminal; OUT1. First output terminal of the level shifting circuit; OUT2. Second output terminal of the level shifting circuit;

20. Boost subcircuit; 21. phase inverter; 30. First phase-inverting subcircuit; 40. First current limiting subcircuit; 50. Second phase-inverting subcircuit; 60. Second current limiting subcircuit; MP1. First P-type transistor; MP2. Second P-type transistor; MP3. Third P-type transistor; MP4. Fourth P-type transistor; MN1. First N-type transistor; MN2. Second N-type transistor; MN3. Third N-type transistor; MN4. Fourth N-type transistor; MN5. Fifth N-type transistor; MN6. Sixth N-type transistor.

DETAILED DESCRIPTION

Specific implementations of the present disclosure will be described below in detail in conjunction with the drawings. It will be appreciated that the specific implementations described herein are for illustrative and explanatory purposes only, not intended to limit the invention.

Figure 1:
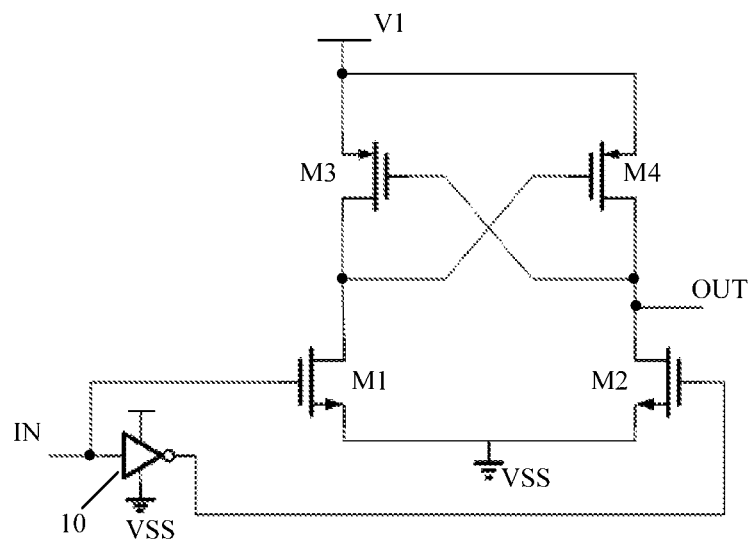
FIG. 1 is a schematic diagram of a first level shifting circuit in the prior art.

FIG. 1 is a structural diagram of a traditional level shifting circuit which includes four transistors (a first transistor M1, a second transistor M2, a third transistor M3, and a fourth transistor M4) and a low voltage phase inverter 10. The first and second transistors M1 and M2 are NMOS transistors, while the third and fourth transistors M3 and M4 are PMOS transistors. The brief working process of the level shifting circuit is as follows: when a low level signal is input via the input terminal IN, the first transistor M1 is turned off and the second transistor M2 is turned on, and the output terminal OUT is electrically coupled to the low level signal terminal VSS to output a low level signal; when a high level signal (the voltage of the high level signal is less than the voltage of the first high level signal terminal V1) via the input terminal IN, the second transistor M2 is turned off and the first transistor M1 is turned on, thereby making the four transistor M4 turned on, and the output terminal OUT being conducted to the first high level signal terminal V1 to output a high level signal.

Figure 2:
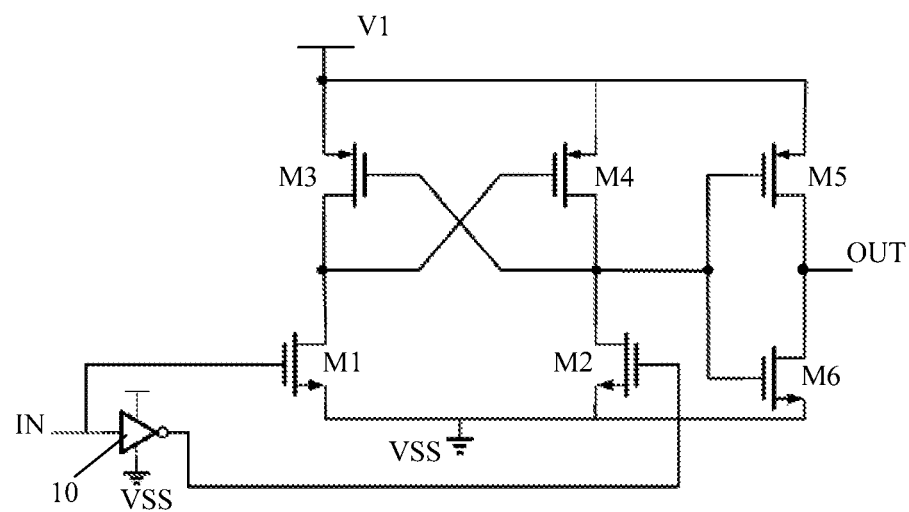
FIG. 2 is a schematic diagram of a second level shifting circuit in the prior art.

However, the level shifting circuit of this structure has a limited driving ability, and cannot drive a large load. For this reason, in the prior art, the level shifting circuit shown in FIG. 2 is obtained by adding a high voltage phase inverter connected in serial with the circuit of FIG. 1 so as to improve the driving ability of the level shifting circuit. The high voltage phase inverter includes a fifth transistor M5 (which is a PMOS transistor) and a sixth transistor M6 (which is an NMOS transistor). In a certain time period in the flipping process of the high voltage phase inverter (i.e., during the signal received by the gate electrode of the fifth transistor M5 is shifted between the high level and the low level), the fifth transistor M5 and the sixth transistor M6 both may be turned on faintly, the first high level signal terminal V1 is electrically coupled to the low level signal terminal VSS and thus generates a large peak current, which not only increases the power consumption, but also affects the reliability of the devices.

Figure 3:
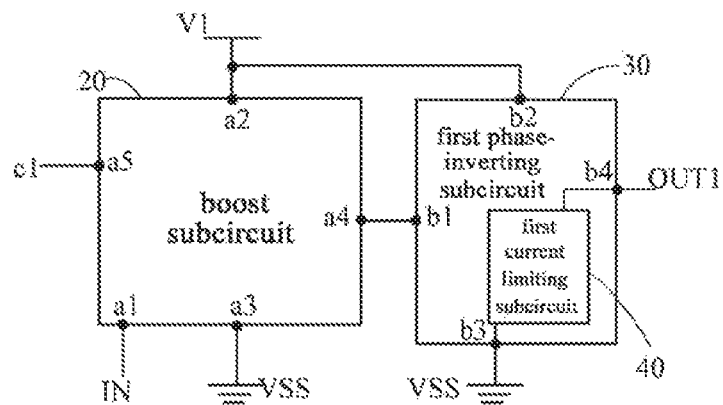
FIG. 3 is a schematic diagram of a structure of a level shifting circuit according to an embodiment of the present disclosure.

In an aspect of the present disclosure, a level shifting circuit is provided. As shown in FIG. 3, the level shifting circuit includes a boost subcircuit 20 and a first phase-inverting subcircuit 30.

A first terminal a1 of the boost subcircuit 20 is coupled to an input terminal IN of the level shifting circuit, a second terminal a2 of the boost subcircuit 20 is coupled to a first high level signal terminal V1, a third terminal a3 of the boost subcircuit 20 is coupled to a low level signal terminal VSS, and a fourth terminal a4 of the boost subcircuit 20 is coupled to a first terminal b1 of the first phase-inverting subcircuit 30. The boost subcircuit 20 is configured to electrically connect the second terminal a2 and the fourth terminal a4 of the boost subcircuit 20 when the input terminal IN of the level shifting circuit receives one of a high level signal and a low level signal; and to electrically connect the third terminal a3 and the fourth terminal a4 of the boost subcircuit 20 when the input terminal IN of the level shifting circuit receives the other of the high level signal and the low level signal; a voltage V_low of the high level signal received by the input terminal IN of the level shifting circuit is smaller than a voltage V_hi of a signal at the first high level signal terminal V1.

A second terminal b2 of the first phase-inverting subcircuit 30 is coupled to the first high level signal terminal V1, a third terminal b3 of the first phase-inverting subcircuit 30 is coupled to the low level signal terminal VSS, a fourth terminal b4 of the first phase-inverting subcircuit 30 is coupled to a first output terminal OUT1 of the level shifting circuit; the first phase-inverting subcircuit 30 is configured to electrically connect the third terminal b3 and the fourth terminal b4 of the first phase-inverting subcircuit 30 when the first terminal b1 thereof receives a high level signal, and to electrically connect the second terminal b2 and the fourth terminal b4 of the first phase-inverting subcircuit 30 when the first terminal b1 of the first phase-inverting subcircuit 30 receives a low level signal.

A first current limiting subcircuit 40 is provided between the second terminal b2 and the fourth terminal b4 of the first phase-inverting subcircuit 30, or between the third terminal b3 and the fourth terminal b4 of the first phase-inverting subcircuit 30; the first current limiting subcircuit 40 is configured to limit a current flowing therethrough such that a maximum value of the current does not exceed a first predetermined value. The first predetermined value should be less than a value of a peak current generated by electrically connecting the first high level signal terminal V1 and the low level signal terminal VSS for a short time via, the first phase-inverting subcircuit 30 during the phase-inverting process of the first phase-inverting subcircuit 30 in the case that the current limiting subcircuit 40 is not provided.

The level shifting circuit is particularly applicable to a high voltage circuit to convert a low voltage signal to a high voltage signal which is different from the low voltage signal by 10V or more. The boost subcircuit 20 may be configured to electrically connect the second terminal a2 and the fourth terminal a4 of the boost subcircuit 20, and disconnect the third terminal a3 and the fourth terminal a4 of the boost subcircuit 20, when the input terminal IN receives a high level signal; to electrically connect the third terminal a3 and the fourth terminal a4 of the boost subcircuit 20, and disconnect the second terminal a2 and the fourth terminal a4 of the boost subcircuit 20, when a low level signal is input at the input terminal IN. In this case, when the input terminal IN receives a low level signal, the third terminal a3 and the fourth terminal a4 of the boost subcircuit 20 are electrically connected while the second terminal a2 and the fourth terminal a4 are disconnected, causing the first terminal b1 of the first phase-inverting subcircuit 30 to receive the low level signal, and thereby electrically connecting the fourth terminal a4 and the second terminal a2 of the boost subcircuit 20, and the first output terminal OUT1 of the level shifting circuit outputs a high level signal with the voltage V_hi, when the input signal at the input terminal IN is a high level signal with the voltage V_low the second terminal a2 and the fourth terminal a4 of the boost subcircuit 20 are electrically connected, so that the first terminal b1 of the first phase-inverting subcircuit 30 is electrically coupled to the first high level signal terminal V1 and receives a high level signal with a higher voltage, thereby electrically connecting the third terminal b3 and the fourth terminal h4 of the first phase-inverting subcircuit 30, and the first output terminal OUT1 of the level shifting circuit outputs a low level signal; thus, the level shifting is achieved, and the output signal at the first output terminal OUT1 and the input signal at the input terminal IN have opposite phases.

The boost subcircuit 20 may also be configured to electrically connect the second terminal a2 and the fourth terminal a4 of the boost subcircuit 20, and disconnect the third terminal a3 and the fourth terminal a4 of the boost subcircuit 20, when the input terminal IN of the level shifting circuit receives a low level signal; to electrically connect the third terminal a3 and the fourth terminal a4 of the boost subcircuit 20, and disconnect the second terminal a2 and the fourth terminal a4 of the boost subcircuit 20, when the input terminal IN of the level shifting circuit receives a high level signal. In this case, when the input terminal IN inputs a high level signal with the voltage V_low the third terminal a3 and the fourth terminal a4 of the boost subcircuit 20 are electrically connected, causing the first terminal hi of the first phase-inverting subcircuit 30 to receive a low level signal, and thereby causing the first output terminal OUT1 of the level shifting circuit to be electrically coupled to the first high level signal terminal V1 to output a high level signal with the voltage of V_hi; when the input terminal IN inputs a low level signal, the second terminal a2 and the fourth terminal a4 of the boost subcircuit 20 are electrically connected, causing the first terminal b1 of the first phase-inverting subcircuit 30 to be electrically coupled to the first high level signal terminal, and thereby electrically connecting the third terminal b3 and the fourth terminal b4 of the first phase-inverting subcircuit 30, and the first output terminal OUT1 of the level shifting circuit outputs a low level signal; therefore, the level shifting is also achieved, and the output signal of the first output terminal OUT1 and the input signal of the input terminal IN have the same phase.

In a case that the fourth terminal a4 of the boost subcircuit 20 is used as the output terminal of the level shifting circuit directly to output a signal, the driving ability is poor although it can achieve the level shifting function. In the case that the fourth terminal a4 of the boost subcircuit 20 and the first phase-inverting subcircuit 30 in series, the characteristics of the devices (the aspect ratios of the transistors) in the first phase-inverting subcircuit 30 are easier to adjust, and the first phase-inverting subcircuit 30 can shape the output voltage. Thus, providing the first phase-inverting subcircuit 30 can improve the driving ability of the level shifting circuit. Moreover, since the first current limiting subcircuit 40 is provided between the second terminal b2 and the fourth terminal b4 of the first phase-inverting subcircuit 30, or between the third terminal b3 and the fourth terminal b4 of the first phase-inverting subcircuit 30, the peak current generated by electrically connecting the first high level signal terminal V1 and the low level signal terminal VSS for a short time during the phase-inverting process of the first phase-inverting subcircuit 30 can be reduced, thereby reducing the power consumption and avoiding the affect of an excessive peak current on the devices. Furthermore, if the first current limiting subcircuit 40 is provided between the second terminal b2 and the fourth terminal b4 of the first phase-inverting subcircuit 30, the speed of electrical conduction between the fourth terminal b4 and the third terminal b3 of the first phase-inverting subcircuit 30 (i.e., the speed by which the signal at the first output terminal OUT1 is inverted from the high level to the low level) is higher, and the driving operation may be performed at a falling edge; if the first current limiting subcircuit 40 is provided between the third terminal b3 and the fourth terminal b4 of the first phase-inverting subcircuit 30, the speed of electrical conduction between the fourth terminal b4 and the second terminal b2 of the first phase-inverting subcircuit 30 (i.e., the speed by which the signal at the first output terminal OUT1 is inverted from the low level to the high level) is higher, and the driving operation may be performed at a rising edge.

The structure of the level shifting circuit will be explained in detail below in conjunction with FIGS. 3 and 4. The boost subcircuit 20 is configured to electrically connect the second terminal a2 and the fourth terminal a4 of the boost subcircuit 20, and to electrically connect the third terminal a3 and the fifth terminal a5 of the boost subcircuit 20, when the first terminal a1 of the boost subcircuit 20 receives a high level signal; to electrically connect the third terminal a3 and the fourth terminal a4 of the boost subcircuit 20, and to electrically connect the second terminal a2 and the fifth terminal a5 of the boost subcircuit 20, when the first terminal at receives a low level signal.

The first phase-inverting subcircuit 30 includes a first P-type transistor MP1 and a first N-type transistor MN1. A gate electrode of the first P-type transistor MP1 is coupled to the first terminal b1 of the first phase-inverting subcircuit 30, a first electrode of the first P-type transistor MP1 is coupled to the second terminal b2 of the first phase-inverting subcircuit 30, and a second electrode of the first P-type transistor MP1 is coupled to the fourth terminal b4 of the first phase-inverting subcircuit 30. A gate electrode of the first N-type transistor MN1 is coupled to the first terminal b1 of the first phase-inverting subcircuit 30, a first electrode of the first N-type transistor MN1 is indirectly coupled to the fourth terminal b4 of the first phase-inverting subcircuit 30 via the first current limiting subcircuit 40, and a second electrode of the first N-type transistor MN1 is coupled to the third terminal h3 of the first phase-inverting subcircuit 30.

The first current limiting subcircuit 40 includes a second N-type transistor MN2. A gate electrode of the second N-type transistor MN2 is coupled to a first current limiting control terminal, a first electrode of the second N-type transistor MN2 is coupled to the fourth terminal b4 of the first phase-inverting subcircuit 30, and the second electrode of the second N-type transistor MN2 is coupled to the first electrode of the first N-type transistor MN1 and thereby is indirectly coupled to the third terminal b3 of the first phase-inverting subcircuit 30; the first current limiting control terminal is configured to provide a low level signal to the gate electrode of the second N-type transistor MN2 so as to turn off the second N-type transistor MN2, when the input terminal IN of the level shifting circuit receives a low level signal; and to provide a high level signal enabling the second. N-type transistor MN2 to be in a saturation region, when the input terminal IN of the level shifting circuit receives a high level signal. The first predetermined value is a magnitude of a driving current between the first electrode and the second electrode of the second N-type transistor MN2 when the second N-type transistor is in the saturation region.

It will be appreciated that the magnitude of the driving current flowing through a transistor is proportional to the aspect ratio of the transistor. In order to ensure that the second N-type transistor MN2 achieves the current limiting function, the aspect ratio of the second N-type transistor MN2 is smaller than the aspect ratio of the first N-type transistor MN1 and the aspect ratio of the first P-type transistor MP1. Specifically, the aspect ratio of the second N-type transistor MN2 may be 0.2 to 0.4 times the aspect ratio of the first N-type transistor MN1, and thus the peak current can be controlled effectively while the driving ability of the level shifting circuit will not be affected.

The first current limiting control terminal may be a signal port provided separately. Optionally, in order to simplify the circuit structure, the first current limiting control terminal is formed integrally with the input terminal IN of the level shifting circuit. As shown in FIG. 3, the second N-type transistor MN2 is directly controlled through the input terminal IN of the level shifting circuit.

The boost subcircuit 20 includes a phase inverter 21, a fifth N-type transistor MN5, a sixth N-type transistor MN6, a third P-type transistor MP3 and a fourth P-type transistor MP4.

A first input terminal of the phase inverter 21 is coupled to the first terminal a1 of the boost subcircuit 20, a second input terminal of the phase inverter 21 is coupled to a second high level signal terminal V2, a third input terminal of the phase inverter 21 is coupled to the low level signal terminal VSS, and an output terminal of the phase inverter 21 is coupled to a gate electrode of the sixth N-type transistor MN6; the phase inverter 21 is configured to electrically connect the third input terminal and the output terminal of the phase inverter 21 when the first input terminal thereof receives a high level signal, and to electrically connect the second input terminal and the output terminal of the phase inverter 21 when the first input terminal of the phase inverter receives a low level signal. The voltage of the signal at the second high level signal terminal V2 is smaller than the voltage of the signal at the first high level signal terminal V1. Specifically, the voltage of the signal at the second high level signal terminal V2 is the voltage V_low as mentioned above.

A gate electrode of the fifth N-type transistor MN5 is coupled to the first terminal a1 of the boost subcircuit 20, a first electrode of the fifth N-type transistor MN5 is coupled to the fifth terminal a5 of the boost subcircuit 20, and a second electrode of the fifth N-type transistor MN5 is coupled to the third terminal a3 of the boost subcircuit 20.

A first electrode of the sixth N-type transistor MN6 is coupled to the fourth terminal a4 of the boost subcircuit 20, and a second electrode of the sixth N-type transistor MN6 is coupled to the third terminal a3 of the boost subcircuit 20.

A gate electrode of the third P-type transistor MP3 is coupled to the fourth terminal a4 of the boost subcircuit 20, a first electrode of the third P-type transistor MP3 is coupled to the second terminal a2 of the boost subcircuit 20, and a second electrode of the third P-type transistor MP3 is coupled to the fifth terminal a5 of the boost subcircuit 20.

A gate electrode of the fourth P-type transistor MP4 is coupled to the fifth terminal a5 of the boost subcircuit 20, a first electrode of the fourth P-type transistor MP4 is coupled to the second terminal a2 of the boost subcircuit 20, and a second electrode of the fourth P-type transistor MP4 is coupled to the fourth terminal a4 of the boost subcircuit 20.

Figure 4:
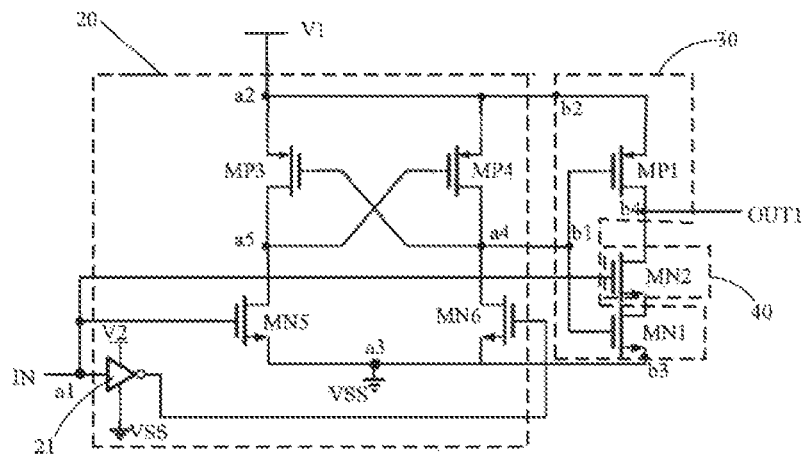
FIG. 4 is a schematic diagram of a circuit structure of a level shifting circuit according to an embodiment of the present disclosure.

The working process of the level shifting circuit shown in FIG. 4 is as follows.

When a low level signal is input at the input terminal IN of the level shifting circuit, the output terminal of the phase inverter 21 outputs a high level signal; in this case, the fifth N-type transistor MN5 is turned off and the sixth N-type transistor MN6 is turned on, causing the fourth terminal a4 of the boost subcircuit 20 is electrically coupled to the low level signal terminal VSS, and thereby causing the third P-type transistor MP3 to be turned on. Since the fifth N-type transistor MN5 is turned off and the sixth N-type transistor MN6 is turned on, the fourth P-type transistor MP4 is turned off gradually, which in turn accelerates the electrical conduction between the fourth terminal a4 of the boost subcircuit 20 and the low level signal terminal VSS and thus the first P-type transistor MP1 is turned on gradually; meanwhile, the second N-type transistor MN2 is turned off due to the low level signal input at the input terminal 1N, causing the first output terminal OUT1 of the level shifting circuit to be electrically coupled to the first high level signal terminal V1 and thus to output the high level signal with the voltage V_hi.

When a high level signal with the voltage V_low (V_low<V_hi) is input at the input terminal IN of the level shifting circuit, the output terminal of the phase inverter 21 outputs a low level signal; in this case, the sixth N-type transistor MN6 is turned off and the fifth N-type transistor MN5 is turned on, causing the gate electrode of the fourth P-type transistor MP4 (the fifth terminal a5 of the boost subcircuit 20) to be electrically coupled to the low level signal terminal VSS to turn on the fourth P-type transistor MP4, and thus the gate electrode of the first P-type transistor MP1 (the fourth terminal a4 of the boost subcircuit 20) is electrically coupled to the first high level signal terminal V1. Since the sixth N-type transistor MN6 is turned off and the fifth N-type transistor MN5 is turned on, the third P-type transistor MP3 is turned off, which in turn accelerates turning on of the fifth N-type transistor MN5, and thereby the fourth P-type transistor MP4 is turned on by the low level signal received at the gate electrode thereof, so that the first P-type transistor MP1 is turned off gradually and the first N-type transistor MN1 is turned on gradually; meanwhile, the second N-type transistor MN2 is turned on by the high level signal input at the input terminal IN, and thus the first output terminal OUT1 outputs a low level signal.

Figure 5:
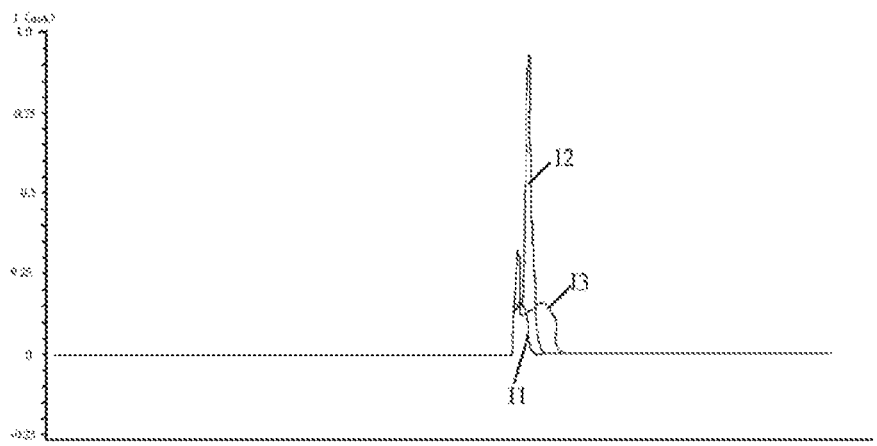
FIG. 5 is a comparison diagram illustrating peak currents generated by the level shifting circuits in FIGS. 1, 2 and 4.

FIG. 5 is a comparison diagram illustrating peak currents generated by the level shifting circuits in FIGS. 1, 2 and 4, in which I1 denotes the peak current generated by the level shifting circuit in FIG. 1, I2 denotes the peak current generated by the level shifting circuit in FIG. 2, and I3 denotes the peak current generated by the level shifting circuit in FIG. 4. It can be seen from FIG. 5 that the peak current generated by the level shifting circuit in FIG. 4 is significantly smaller than that generated by the level shifting circuit in FIG. 2, and slightly greater than that generated by the level shifting circuit in FIG. 1 (however, having a low driving ability).

Figure 6:
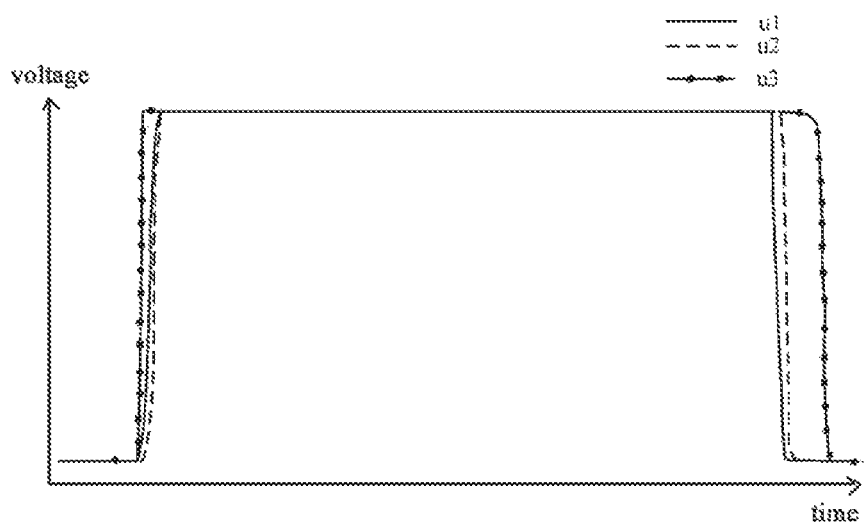
FIG. 6 is a comparison diagram illustrating changes of output voltages of the level shifting circuits in FIGS. 1, 2 and 4.

FIG. 6 is a comparison diagram illustrating changes of output voltages of the level shifting circuits in FIGS. 1, 2 and 4, in which u1 denotes the output voltage curve of the level shifting circuit in FIG. 1, u2 denotes the output voltage curve of the level shifting circuit in FIG. 2, and u3 denotes the output voltage curve of the level shifting circuit in FIG. 4. It can be seen from FIG. 6 that, at the rising edge, the flipping speed of the level shifting circuit in FIG. 4 is larger than that of FIG. 1 and that of FIG. 2. The circuit of FIG. 4 may be used for rising-edge driving, and thereby the power consumption may be further reduced.

It can be seen that the level shifting circuit of FIG. 4 provided by the present disclosure can reduce the peak current at the rising edge and increase the flipping speed at the rising edge as compared with the level shifting circuit in the prior art. It should be noted that, if the circuit is used for falling-edge driving, the first current limiting subcircuit 40 may be provided between the second terminal b2 and the fourth terminal b4 of the first phase-inverting subcircuit 30 so as to reduce the peak current and the flipping speed at the falling edge. In this case, the first current limiting subcircuit 40 includes a P-type transistor which may be turned off when a high level signal is input at the input terminal IN of the level shifting circuit inputs and be in the saturation state when a low level signal is input at the input terminal IN.

It should be also noted that, the level shifting circuit of FIG. 4 can achieve oppositely-phased output signal. Obviously, as described above, the boost subcircuit 20 may also be configured to electrically connect the second terminal and the fourth terminal of the boost subcircuit 20 when the input terminal IN of the level shifting circuit receives a low level signal; and to electrically connect the third terminal and the fourth terminal of the boost subcircuit 20 when the input terminal IN of the level shifting circuit receives a high level signal, thereby achieving an in-phase output signal. In this case, the second electrode of the third P-type transistor MP3 may be used as the fourth terminal of the boost subcircuit 20, and the second electrode of the fourth P-type transistor MP4 may be used as the fifth terminal of the boost subcircuit 20, i.e., the first terminal of the first phase-inverting subcircuit 30 is coupled to the second electrode of the third P-type transistor MP3, which results in improvement of the driving ability and reducing the power consumption in the case of output of an in-phase output signal. The specific working principle is similar to that of the circuit in FIG. 4, and will not be described in detail here.

Figure 7:
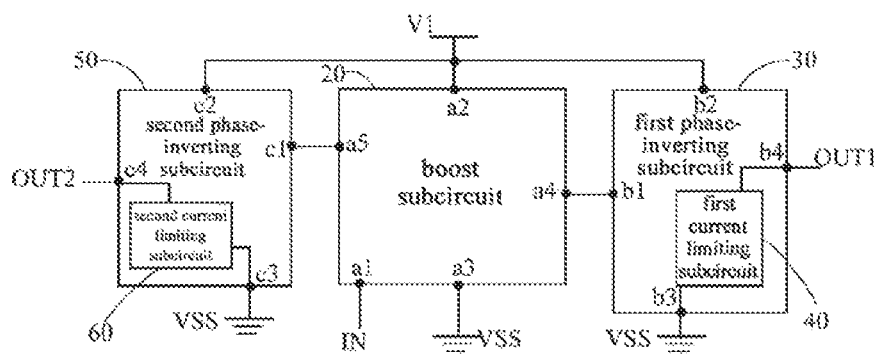
FIG. 7 is a schematic diagram of a structure of a level shifting circuit according to an embodiment of the present disclosure.
Figure 8:
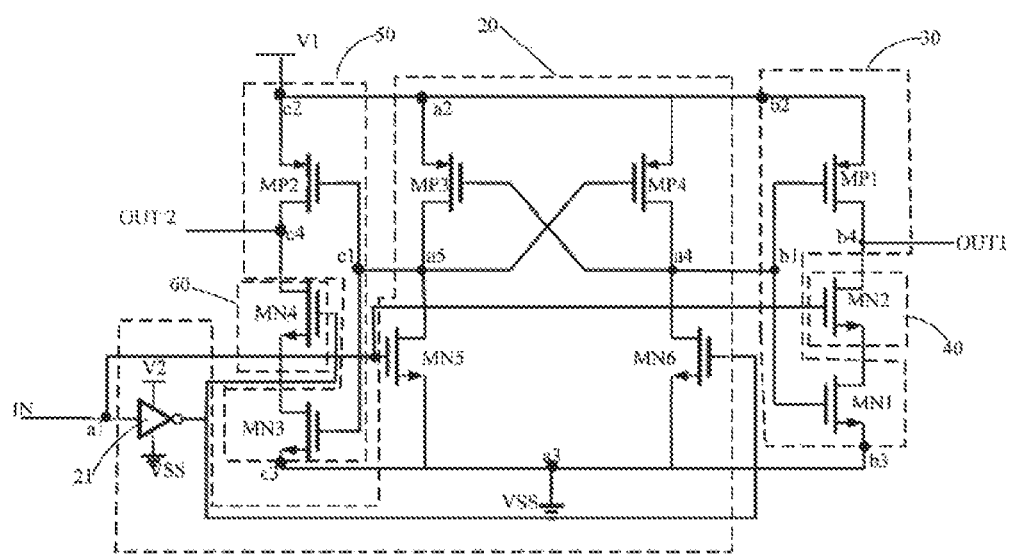
FIG. 8 is a schematic diagram of a circuit structure of a level shifting circuit according to an embodiment of the present disclosure.

FIG. 7 is a schematic diagram of a structure of a level shifting circuit according to an embodiment of the present disclosure, and FIG. 8 is a schematic diagram of a specific structure of a level shifting circuit according to an embodiment of the present disclosure. In this structure of the level shifting circuit, the boost subcircuit 20, the first phase-inverting subcircuit 30 and the first current limiting subcircuit 40 as above are also included, and have the same structures as those in FIG. 4 and will not be described repeatedly. Only the differences between the two structures are described below.

As shown in FIGS. 7 and 8, in addition to the boost subcircuit 20, the first phase-inverting subcircuit 30 and the first current limiting subcircuit 40 as above in FIGS. 3 and 4, the level shifting circuit further includes a second phase-inverting subcircuit 50 and a second current limiting subcircuit 60. A first terminal c1 of the second phase-inverting subcircuit 50 is coupled to the fifth terminal a5 of the boost subcircuit 20, the second terminal c2 of the second phase-inverting subcircuit 50 is coupled to the first high level signal terminal V1, the third terminal c3 of the second phase-inverting subcircuit 50 is coupled to the low level signal terminal VSS, and the fourth terminal c4 of the second phase-inverting subcircuit 50 is coupled to the second output terminal OUT2 of the level shifting circuit; the second phase-inverting subcircuit 50 is configured to electrically connect the third terminal c3 thereof and the fourth terminal c4 thereof when the first terminal c1 thereof receives a high level signal; and to electrically connect the second terminal c2 thereof and the fourth terminal c4 thereof when the first terminal c1 thereof receives a low level signal. A second current limiting subcircuit 60 is provided between the second terminal c2 and the fourth terminal c4 of the second phase-inverting subcircuit 50, or between the third terminal c3 and the fourth terminal c4 of the second phase-inverting subcircuit 50, so that the maximum value of the current does not exceed a second predetermined value.

As described above, the boost subcircuit 20 can electrically connect the second terminal a2 and the fourth terminal a4 of the boost subcircuit 20, and the third terminal a3 and the fifth terminal a5 of the boost subcircuit 20, when the first terminal a1 thereof receives a high level signal; and electrically connect the third terminal a3 and the fourth terminal a4 of the boost subcircuit 20, and the second terminal a2 and the fifth terminal a5 of the boost subcircuit 20, when the first terminal a1 thereof receives a low level signal. Therefore, when the input voltage at the input terminal IN of the level shifting circuit is the high level signal with the voltage V_low, the first output terminal OUT1 of the level shifting circuit can output a low level signal, and the second output terminal OUT2 is electrically coupled to the first high level signal terminal V1 to output the high level signal with the voltage V_hi; when the input terminal IN of the level shifting circuit inputs a low level signal, the first output terminal OUT1 of the level shifting circuit can output the high level signal with the voltage V_hi, and the second output terminal OUT2 outputs a low level signal, thereby achieving both the in-phase output signal and the oppositely-phased output signal. Like the first current limiting subcircuit 40, the second current limiting subcircuit 60 can reduce the peak current generated by the second output terminal OUT2.

Specifically, as shown in FIG. 8, the second phase-inverting subcircuit 50 includes a second P-type transistor MP2 and a third N-type transistor MN3. A gate electrode of the second P-type transistor MP2 is coupled to the first terminal c1 of the second phase-inverting subcircuit 50, a first electrode of the second P-type transistor MP2 is coupled to the second terminal c2 of the second phase-inverting subcircuit 50, and the second electrode of the second P-type transistor MP2 is coupled to the fourth terminal c4 of the second phase-inverting subcircuit 50. A gate electrode of the third N-type transistor MN3 is coupled to the first terminal c1 of the second phase-inverting subcircuit 50, the first electrode of the third N-type transistor MN3 is coupled to the fourth terminal c4 of the second phase-inverting subcircuit 50, and the second electrode of the third N-type transistor MN3 is coupled to the third terminal c3 of the second phase-inverting subcircuit 50.

The first electrode of the third N-type transistor MN3 is coupled to the fourth terminal c4 of the second phase-inverting subcircuit 50 via the second current limiting subcircuit 60. The second current limiting subcircuit 60 includes a fourth N-type transistor MN4. A gate electrode of the fourth N-type transistor MN4 is coupled to the second current limiting control terminal, a first electrode of the fourth N-type transistor MN4 is coupled to the fourth terminal c4 of the second phase-inverting subcircuit 50, and the second electrode of the fourth N-type transistor MN4 is coupled to the third terminal c3 of the second phase-inverting subcircuit 50 via the third N-type transistor MN3. The second current limiting subcircuit 60 is configured to provide a low level signal to turn off the fourth N-type transistor MN4 when the input terminal IN of the level shifting circuit receives a high level signal; and to provide a high level signal causing the fourth N-type transistor MN4 to be in a saturation region when the input terminal of the level shifting circuit receives a low level signal; the second predetermined value is a magnitude of a driving current between the first electrode and the second electrode of the fourth N-type transistor MN4 When the fourth N-type transistor MN4 is in the saturation region.

Optionally, the second current limiting control terminal is formed integrally with the output terminal of the phase inverter 21. Furthermore, an aspect ratio of the fourth N-type transistor MN4 is smaller than an aspect ratio of the third N-type transistor MN3 and an aspect ratio of the second P-type transistor MP2. The aspect ratio of the fourth N-type transistor MN4 may be 0.2 to 0.4 times the aspect ratio of the third. N-type transistor MN3 so as to ensure that the peak current of the second output terminal OUT2 is reduced while improving the driving ability of the second output terminal OUT2.

During the working process of the level shifting circuit shown in FIG. 8, the voltages of the signals at the terminals of the boost subcircuit 20, the voltages of the signals at the terminals of the first phase-inverting subcircuit 30, the on/off states of the transistors in the boost subcircuit 20 and the first phase-inverting subcircuit 30 are the same as those of the level shifting circuit in FIG. 4; for details, see the working process in FIG. 4 as described above. Furthermore, in the level shifting circuit shown in FIG. 8, when the input terminal IN of the level shifting circuit inputs a low level signal, the output terminal of the phase inverter 21 outputs a high level signal so that the fourth N-type transistor MN4 is turned on; meanwhile, as described above, the fifth N-type transistor MN5 is turned off and the third P-type transistor MP3 is turned on, so that the fifth terminal a5 of the boost subcircuit 20 is electrically coupled to the first high level signal terminal V1, causing the third N-type transistor MN3 to be turned on and the second P-type transistor MP2 to be turned off, and thus the second output terminal OUT2 is electrically coupled to the low level signal terminal VSS to output a low level signal; at this point, the output voltage of the first output terminal OUT1 is the high level signal with the voltage V_hi. When the input terminal IN of the level shifting circuit inputs the high level signal with the voltage V_low, the output terminal of the phase inverter 21 outputs a low level signal so that the fourth N-type transistor MN4 is turned off; meanwhile, as described above, the fifth N-type transistor MN5 is turned on and the third P-type transistor MP3 is turned off, so that the fifth terminal a5 of the boost subcircuit 20 is electrically coupled to the low level signal terminal VSS, causing the third N-type transistor MN3 to be turned off and the second P-type transistor MP2 to be turned on, and thus the second output terminal OUT2 is electrically coupled to the first high level signal terminal V1 to output the high level signal with the voltage V_hi; at this point, the first output terminal OUT1 outputs a low level signal.

In the present disclosure, each transistor may be a Metal-Oxide-Semiconductor transistor (a MOS transistor). The first electrode of each transistor is one of a source electrode and a drain electrode, and the second electrode thereof is the other of the source electrode and the drain electrode.

Foregoing has described the level shifting circuit provided by the present disclosure. It can be seen that the level shifting circuit of the present disclosure includes the first phase-inverting subcircuit, the second phase-inverting subcircuit, the first current limiting subcircuit and the second current limiting subcircuit; the first and second current limiting subcircuits can reduce the peak current generated by the level shifting circuit and improve the flipping speed, and thereby the power consumption is reduced while the driving ability is ensured; moreover, providing both the first phase-inverting subcircuit and the second phase-inverting subcircuit can achieve the bidirectional driving. In addition, the level shifting circuit has a simple structure and is applicable to practical industrial production, especially to the driving chips which are generally required to have the level shifting function.

It will be appreciated that, the above implementations are only exemplary implementations for illustrating the principle of the present disclosure. However, the present disclosure is not limited thereto. An ordinary person skilled in the art can make various modifications and improvements to the present disclosure without departing from the essence of the present disclosure. These modifications and improvements should be also considered as the protective scope of the present disclosure.

What is claimed is:

1. A level shifting circuit, comprising a boost subcircuit and a first phase-inverting subcircuit, wherein
the boost subcircuit has a first terminal being coupled to an input terminal of the level shifting circuit, a second terminal being coupled to a first high level signal terminal, a third terminal being coupled to a low level signal terminal, a fourth terminal being directly coupled to a first terminal of the first phase-inverting subcircuit; the boost subcircuit is configured to electrically connect the second terminal and the fourth terminal of the boost subcircuit when the input terminal of the level shifting circuit receives one of a high level signal and a low level signal, and to electrically connect the third terminal and the fourth terminal of the boost subcircuit when the input terminal of the level shifting circuit receives the other of the high level signal and the low level signal; a voltage of the high level signal received by the input terminal of the level shifting circuit is smaller than a voltage of a signal at the first high level signal terminal;
the first phase-inverting subcircuit has a second terminal being coupled to the first high level signal terminal, a third terminal being coupled to the low level signal terminal, and a fourth terminal being coupled to a first output terminal of the level shifting circuit; the first phase-inverting subcircuit is configured to electrically connect the third terminal and the fourth terminal of the first phase-inverting subcircuit when the first terminal of the first phase-inverting subcircuit receives a high level signal, and to electrically connect the second terminal and the fourth terminal of the first phase-inverting subcircuit when the first terminal of the first phase-inverting subcircuit receives a low level signal;
a first current limiting subcircuit is provided between the second terminal and the fourth terminal of the first phase-inverting subcircuit, or between the third terminal and the fourth terminal of the first phase-inverting subcircuit, and the first current limiting subcircuit is configured to limit a current flowing therethrough such that a maximum value of the current does not exceed a first predetermined value,
wherein the first phase-inverting subcircuit comprises:
a first P-type transistor having a gate electrode being coupled to the first terminal of the first phase-inverting subcircuit, a first electrode being coupled to the second terminal of the first phase-inverting subcircuit, and a second electrode being coupled to the fourth terminal of the first phase-inverting subcircuit; and
a first N-type transistor having a gate electrode being coupled to the first terminal of the first phase-inverting subcircuit, a first electrode being coupled to the fourth terminal of the first phase-inverting subcircuit, and a second electrode being coupled to the third terminal of the first phase-inverting subcircuit, wherein the boost subcircuit is configured to electrically connect the second terminal and the fourth terminal of the boost subcircuit when the first terminal thereof receives a high level signal;

the first current limiting subcircuit comprises a second N-type transistor, the second N-type transistor has a gate electrode being coupled to a first current limiting control terminal, a first electrode being coupled to the fourth terminal of the first phase-inverting subcircuit, and a second electrode being coupled to the first electrode of the first N-type transistor; the first current limiting control terminal is configured to provide a low level signal to turn off the second N-type transistor when the input terminal of the level shifting circuit receives a low level signal, and to provide a high level signal enabling the second N-type transistor to be in a saturation region when the input terminal of the level shifting circuit receives a high level signal; and the first predetermined value is a magnitude of a driving current between the first electrode and the second electrode of the second N-type transistor when the second N-type transistor is in the saturation region.

2. The level shifting circuit of claim 1, wherein an aspect ratio of the second N-type transistor is smaller than an aspect ratio of the first N-type transistor and an aspect ratio of the first P-type transistor.

3. The level shifting circuit of claim 2, wherein the aspect ratio of the second N-type transistor is 0.2 to 0.4 times the aspect ratio of the first N-type transistor.

4. The level shifting circuit of claim 1, wherein the first current limiting control terminal is the input terminal of the level shifting circuit.

5. The level shifting circuit of claim 2, wherein the first current limiting control terminal is the input terminal of the level shifting circuit.

6. The level shifting circuit of claim 3, wherein the first current limiting control terminal is the input terminal of the level shifting circuit.

7. A level shifting circuit, comprising a boost subcircuit and a first phase-inverting subcircuit, wherein the boost subcircuit has a first terminal being coupled to an input terminal of the level shifting circuit, a second terminal being coupled to a first high level signal terminal, a third terminal being coupled to a low level signal terminal, a fourth terminal being directly coupled to a first terminal of the first phase-inverting subcircuit; the boost subcircuit is configured to electrically connect the second terminal and the fourth terminal of the boost subcircuit when the input terminal of the level shifting circuit receives one of a high level signal and a low level signal, and to electrically connect the third terminal and the fourth terminal of the boost subcircuit when the input terminal of the level shifting circuit receives the other of the high level signal and the low level signal; a voltage of the high level signal received by the input terminal of the level shifting circuit is smaller than a voltage of a signal at the first high level signal terminal;

the first phase-inverting subcircuit has a second terminal being coupled to the first high level signal terminal, a third terminal being coupled to the low level signal terminal, and a fourth terminal being coupled to a first output terminal of the level shifting circuit; the first phase-inverting subcircuit is configured to electrically connect the third terminal and the fourth terminal of the first phase-inverting subcircuit when the first terminal of the first phase-inverting subcircuit receives a high level signal, and to electrically connect the second terminal and the fourth terminal of the first phase-inverting subcircuit when the first terminal of the first phase-inverting subcircuit receives a low level signal;

a first current limiting subcircuit is provided between the second terminal and the fourth terminal of the first phase-inverting subcircuit, or between the third terminal and the fourth terminal of the first phase-inverting subcircuit, and the first current limiting subcircuit is configured to limit a current flowing therethrough such that a maximum value of the current does not exceed a first predetermined value, wherein the first phase-inverting subcircuit comprises:

a first P-type transistor having a gate electrode being coupled to the first terminal of the first phase-inverting subcircuit, a first electrode being coupled to the second terminal of the first phase-inverting subcircuit, and a second electrode being coupled to the fourth terminal of the first phase-inverting subcircuit; and a first N-type transistor having a gate electrode being coupled to the first terminal of the first phase-inverting subcircuit, a first electrode being coupled to the fourth terminal of the first phase-inverting subcircuit, and a second electrode being coupled to the third terminal of the first phase-inverting subcircuit, wherein the first current limiting subcircuit is provided between the second terminal and the fourth terminal of the first phase-inverting subcircuit, and comprises a sixth P-type transistor, which has a gate electrode being coupled to a first current limiting control terminal, a first electrode being coupled to the second terminal of the first phase-inverting subcircuit, and a second electrode being coupled to the first electrode of the first P-type transistor; the first current limiting control terminal is configured to provide a low level signal to cause the sixth P-type transistor to be in a saturation state when the input terminal of the level shifting circuit receives a low level signal, and to cause the sixth P-type transistor to be turned off when the input terminal of the level shifting circuit receives a high level signal; and the first predetermined value is a magnitude of a driving current between the first electrode and the second electrode of the sixth P-type transistor when the sixth P-type transistor is in the saturation state.

8. The level shifting circuit of 7, wherein the first current limiting control terminal is the input terminal of the level shifting circuit.

9. The level shifting circuit of claim 1, wherein, the level shifting circuit further comprises a second phase-inverting subcircuit, which has a first terminal being coupled to a fifth terminal of the boost subcircuit, a second terminal being coupled to the first high level signal terminal, a third terminal being coupled to the low level signal terminal, and a fourth terminal being coupled to a second output terminal of the level shifting circuit; the second phase-inverting subcircuit is configured to electrically connect the third terminal and the fourth terminal of the second phase-inverting subcircuit when the first terminal of the second phase-inverting subcircuit receives a high level signal, and to electrically connect the second terminal and the fourth terminal thereof when the first terminal of the second phase-inverting subcircuit receives a low level signal; and the boost subcircuit is configured to electrically connect the second terminal and the fourth terminal of the boost subcircuit and to electrically connect the third terminal and the fifth terminal of the boost subcircuit when the first terminal of the boost subcircuit receives a high level signal, and configured to electrically connect the third terminal and the fourth terminal of the boost subcircuit and electrically connect the second terminal and the fifth terminal of the boost subcircuit when the first terminal of the boost subcircuit receives a low level signal.

10. The level shifting circuit of claim 8, wherein,
the level shifting circuit further comprises a second phase-inverting subcircuit, which has a first terminal being coupled to a fifth terminal of the boost subcircuit, a second terminal being coupled to the first high level signal terminal, a third terminal being coupled to the low level signal terminal, and a fourth terminal being coupled to a second output terminal of the level shifting circuit; the second phase-inverting subcircuit is configured to electrically connect the third terminal and the fourth terminal of the second phase-inverting subcircuit when the first terminal of the second phase-inverting subcircuit receives a high level signal, and to electrically connect the second terminal and the fourth terminal thereof when the first terminal of the second phase-inverting subcircuit receives a low level signal; and the boost subcircuit is configured to electrically connect the second terminal and the fourth terminal of the boost subcircuit and to electrically connect the third terminal and the fifth terminal of the boost subcircuit when the first terminal of the boost subcircuit receives a high level signal, and configured to electrically connect the third terminal and the fourth terminal of the boost subcircuit and electrically connect the second terminal and the fifth terminal of the boost subcircuit when the first terminal of the boost subcircuit receives a low level signal.

11. The level shifting circuit of claim 10, wherein the second phase-inverting subcircuit comprises:
a second P-type transistor having a gate electrode being coupled to the first terminal of the second phase-inverting subcircuit, a first electrode being coupled to the second terminal of the second phase-inverting subcircuit, and a second electrode being coupled to the fourth terminal of the second phase-inverting subcircuit; and
a third N-type transistor having a gate electrode being coupled to the first terminal of the second phase-inverting subcircuit, a first electrode being coupled to the fourth terminal of the second phase-inverting subcircuit, and a second electrode being coupled to the third terminal of the second phase-inverting subcircuit.

12. The level shifting circuit of claim 11, wherein a second current limiting subcircuit is provided between the second terminal and the fourth terminal of the second phase-inverting subcircuit, or between the third terminal and the fourth terminal of the second phase-inverting subcircuit, and the second current subcircuit is configured to limit a current flowing therethrough such that a maximum value of the current does not exceed a second predetermined value.

13. The level shifting circuit of claim 12, wherein the second current limiting subcircuit comprises a fourth N-type transistor, which has a gate electrode being coupled to a second current limiting control terminal, a first electrode being coupled to the fourth terminal of the second phase-inverting subcircuit, a second electrode being coupled to the first electrode of the third N-type transistor; the second current limiting control terminal is configured to provide a low level signal to turn off the fourth N-type transistor when the input terminal of the level shifting circuit receives a high level signal, and to provide a high level signal causing the fourth N-type transistor to be in a saturation region when the input terminal of the level shifting circuit receives a low level signal; and the second predetermined value is a magnitude of a driving current between the first electrode and the second electrode of the fourth N-type transistor when the fourth N-type transistor is in the saturation region.

14. The level shifting circuit of claim 13, wherein an aspect ratio of the fourth N-type transistor is smaller than an aspect ratio of the third N-type transistor and an aspect ratio of the second P-type transistor.

15. The level shifting circuit of claim 14, wherein the aspect ratio of the fourth N-type transistor is 0.2 to 0.4 times the aspect ratio of the third N-type transistor.

16. The level shifting circuit of claim 1, wherein the boost subcircuit comprises a phase inverter, a fifth N-type transistor, a sixth N-type transistor, a third P-type transistor and a fourth P-type transistor;
the phase inverter has a first input terminal being coupled to the first terminal of the boost subcircuit, a second input terminal being coupled to a second high level signal terminal, a third input terminal being coupled to the low level signal terminal, and an output terminal being coupled to a gate electrode of the sixth N-type transistor; the phase inverter is configured to electrically connect the third input terminal and the output terminal of the phase inverter when the first input terminal of the phase inverter receives a high level signal, and to electrically connect the second input terminal and the output terminal of the phase inverter when the first input terminal of the phase inverter receives a low level signal; and a voltage of a signal at the second high level signal terminal is smaller than a voltage of a signal at the first high level signal terminal;
the fifth N-type transistor has a gate electrode being coupled to the first terminal of the boost subcircuit, a first electrode being coupled to the fifth terminal of the boost subcircuit, and a second electrode being coupled to the third terminal of the boost subcircuit;
the sixth N-type transistor has a first electrode being coupled to the fourth terminal of the boost subcircuit, and a second electrode being coupled to the third terminal of the boost subcircuit;
the third P-type transistor has a gate electrode being coupled to the fourth terminal of the boost subcircuit, a first electrode being coupled to the second terminal of the boost subcircuit, and a second electrode being coupled to the fifth terminal of the boost subcircuit; and
the fourth P-type transistor has a gate electrode being coupled to the fifth terminal of the boost subcircuit, a first electrode being coupled to the second terminal of the boost subcircuit, and a second electrode being coupled to the fourth terminal of the boost subcircuit.

17. The level shifting circuit of claim 16, wherein the second current limiting control terminal is the output terminal of the phase inverter.

18. A display device, comprising a control circuit, an output stage, and the level shifting circuit of claim 1, wherein
the level shifting circuit is arranged between the control circuit and the output stage to convert a low voltage control signal into a high voltage control signal for the output stage.

19. A display device, comprising a control circuit, an output stage, and the level shifting circuit of claim 7, wherein
 the level shifting circuit is arranged between the control circuit and the output stage to convert a low voltage control signal into a high voltage control signal for the output stage.

\* \* \* \* \*